(12) United States Patent
Komori

(10) Patent No.: US 7,173,500 B2
(45) Date of Patent: Feb. 6, 2007

(54) DIFFERENTIAL OSCILLATOR CIRCUIT

(75) Inventor: Hiroshi Komori, Ohtsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 81 days.

(21) Appl. No.: 11/029,019

(22) Filed: Jan. 5, 2005

(65) Prior Publication Data

US 2005/0179502 A1    Aug. 18, 2005

(30) Foreign Application Priority Data

Jan. 8, 2004    (JP) .............................. 2004-003012

(51) Int. Cl.
*H03B 5/08*    (2006.01)
(52) U.S. Cl. ............ 331/167; 331/117 R; 331/117 FE; 331/177 V
(58) Field of Classification Search .......... 331/117 FE, 331/117 R, 177 V, 167

See application file for complete search history.

(56) References Cited

U.S. PATENT DOCUMENTS 6,690,244 B2 *    2/2004    Mernyei et al. ........ 331/117 R

OTHER PUBLICATIONS

R Aparico, et al.; "A Noise-Shifting Differential Colpitts VCO," IEEE Journal of Solid-State Circuits, vol. 37, No. 12, Dec. 2002, pp. 1728-1736.

* cited by examiner

*Primary Examiner*—Arnold Kinkead
(74) *Attorney, Agent, or Firm*—Stevens, Davis, Miller & Mosher, LLP

(57) ABSTRACT

In a configuration wherein an output signal from a differential oscillator is input into a differential buffer amplifier, an operating current for the differential oscillator including a resonator, which has a node at the midpoint of an inductor, and a pair of field-effect transistors for oscillation and an operating current for the differential buffer amplifier including a pair of bipolar transistors for amplification are made common. In order to obtain the common operating current, the current from the pair of bipolar transistors for amplification is fed from the midpoint of the inductor into the pair of field-effect transistors for oscillation.

8 Claims, 5 Drawing Sheets

DIFFERENTIAL OSCILLATOR CIRCUIT

BACKGROUND OF THE INVENTION

1. Field of the Invention

The present invention relates to a differential oscillator circuit incorporated in a semiconductor device. More particularly, it relates to a differential oscillator circuit wherein the operating current of an oscillator and the operating current of a buffer amplifier are made common.

2. Background Art

In recent years, semiconductor devices used for portable gear have been required to have lower current consumption. Because of this, a method has been used frequently which reduces current consumption as a whole by adopting a stack structure, in which plural circuits having different functions are vertically stacked, to make operating currents for the circuits common. In oscillator circuits as well, a configuration shown in FIG. 4 has been well known as a circuit in which an oscillator proper and a buffer amplifier are driven by a common current.

FIG. 4 is a circuit diagram for showing a configuration of a related art oscillator circuit having a buffer amplifier. In FIG. 4, reference numeral 45 denotes a common-collector Colpitts-type oscillator. Reference numeral 44 denotes a commom-emitter buffer amplifier. Reference numeral 43 denotes an output terminal. Reference numeral 46 denotes a coupling capacitor. Reference numeral 47 denotes a decoupling capacitor. Reference numerals 55, 56, 57, and 58 denote a resistor respectively.

The oscillator 45 is the Colpitts oscillator circuit wherein a capacitor 49 is connected between the base and emitter of a bipolar transistor 48, a capacitor 50 is connected between the emitter and collector of the bipolar transistor 48, and a capacitor 51 and an inductor 52 are connected in series between the base and the collector. The oscillator 45 takes the form of collector common, and the collector of the bipolar transistor 48 is grounded via the decoupling capacitor 47.

The buffer amplifier 44 is a common-emitter amplifier, and the emitter of a bipolar transistor 53 is grounded via the decoupling capacitor 47 and have an inductor 54 as a load.

An Oscillation signal output from the oscillator 45 is input via the coupling capacitor 46 into the buffer amplifier 44 and is output from the output terminal 43.

In the circuit shown in FIG. 4, a common operating current flows into the bipolar transistor 48 included in the oscillator 45 and the bipolar transistor 53 included in the buffer amplifier 44.

However, since this configuration effects single-ended operation, this oscillator circuit is sensitive to noise conveyed via its power source and substrate. In consequence, the oscillator circuit has the drawback of a tendency to cause unstable oscillation operation.

For this reason, a technique using a differential circuit which effects balanced operation has been proposed as an oscillator incorporated in semiconductor devices (see, for example, non-patent literature 1).

FIG. 5 is a circuit diagram showing the configuration of a differential oscillator disclosed in the non-patent literature 1. This differential oscillator comprises a pair of field-effect transistors. In FIG. 5, reference numeral 12 denotes a differential oscillator. The differential oscillator 12 takes the form of a differential oscillator circuit as follows: the drain of the field-effect transistor 18 is connected to the gate of the field-effect transistor 19, and the drain of the field-effect transistor 19 is connected to the gate of the field-effect transistor 18; both ends of a resonator 14 comprised of an inductor 16 and a capacitor 17 in parallel are connected to the respective drains of the field-effect transistors 18 and 19; the sources of the field-effect transistors 18 and 19 are connected to the drain of a field-effect transistor 20; the gate of the field-effect transistor 20 is biased via a bias terminal 15 to govern an operating current which flows into the differential oscillator 12; and the midpoint of the inductor 16 is provided with a power supply voltage Vcc.

The non-patent literature 1 is as follows: Aparicio, R. and Hajimili, A., "A Noise-Shifting Differential Colpitts VCO", IEEE J. Solid-State Circuits, December 2002, Vol. 37, pp. 1728 to 1736 (FIG. 1).

However, since oscillators using the differential circuit shown in FIG. 5 do not include a buffer amplifier, the problem of increased current consumption is caused, so that such oscillators are required to include the buffer amplifier.

SUMMARY OF THE INVENTION

It is an object of the present invention to provide a differential oscillator circuit capable of reducing current consumption.

In order to attain the object, the differential oscillator circuit of the invention comprises a differential oscillator and a differential buffer amplifier into which an output signal from the differential oscillator is input, and both passages of operating currents for the differential oscillator and the differential buffer amplifier are connected in series to each other.

According to the configuration, since both passages of the operating currents for the differential oscillator and the differential buffer amplifier are connected in series to each other, it is possible to make the operating currents for the differential oscillator and the differential buffer amplifier common. As a result, feeding the common operating current into the differential oscillator and the differential buffer amplifier makes it possible to reduce current consumption as a whole when compared with feeding different operating currents into a differential oscillator and a differential buffer amplifier. In addition, the adoption of the differential circuit configuration allows increased noise immunity.

The differential oscillator includes a resonator and a pair of active elements for oscillation, and the differential buffer amplifier includes a pair of active elements for amplification. The operating current for the differential oscillator is a first operating current which flows through the pair of active elements for oscillation. The operating current for the differential buffer amplifier is a second operating current which flows through the pair of active elements for amplification. The operating current which flows through the pair of active elements for oscillation flows through the pair of active elements for amplification as the operating current as it is.

The resonator includes a parallel circuit of an inductor and a capacitor, and has a node at the midpoint of the inductor. The differential oscillator is supplied with the operating current from the midpoint of the inductor.

It is preferable that the pair of active elements for oscillation be, for example, a pair of field-effect transistors whose sources are connected to each other, the resonator be connected between the drains of the pair of the field-effect transistors, and the pair of field-effect transistors be connected to each other in such a cross-coupled manner that the drain of one field-effect transistor is connected to the gate of the other field-effect transistor respectively. The common source of the pair of field-effect transistors is connected to the drain of a field-effect transistor for a current source whose gate is provided with a predetermined bias voltage.

Also, it is preferable that the pair of active elements for oscillation be, for example, a pair of bipolar transistors whose emitters are connected to each other, a resonator be connected between the collectors of the pair of bipolar transistors, and the pair of bipolar transistors be connected to each other in such a cross-coupled manner that the collector of one bipolar transistor is connected to the base of the other bipolar transistor respectively. The bases of the pair of bipolar transistors are provided with a predetermined bias voltage via first and second resistors, and the common emitter of the pair of bipolar transistors is grounded via a third resistor.

Further, it is preferable that the differential oscillator be a common-base or common-gate Colpitts oscillator.

Still further, it is preferable that the resonator include a varactor diode connected in parallel to the inductor. A resonance frequency can be changed by changing a voltage fed to the varactor diode.

As described above, the differential oscillator and the differential buffer amplifier employing the noise-immune differential circuit can be driven by the common operating current, so that current consumption can be reduced as a whole.

DESCRIPTION OF THE EXEMPLARY EMBODIMENTS

First Embodiment

In the following, a differential oscillator circuit according to a first embodiment of the present invention will be explained with reference to the drawings.

Figure 1:
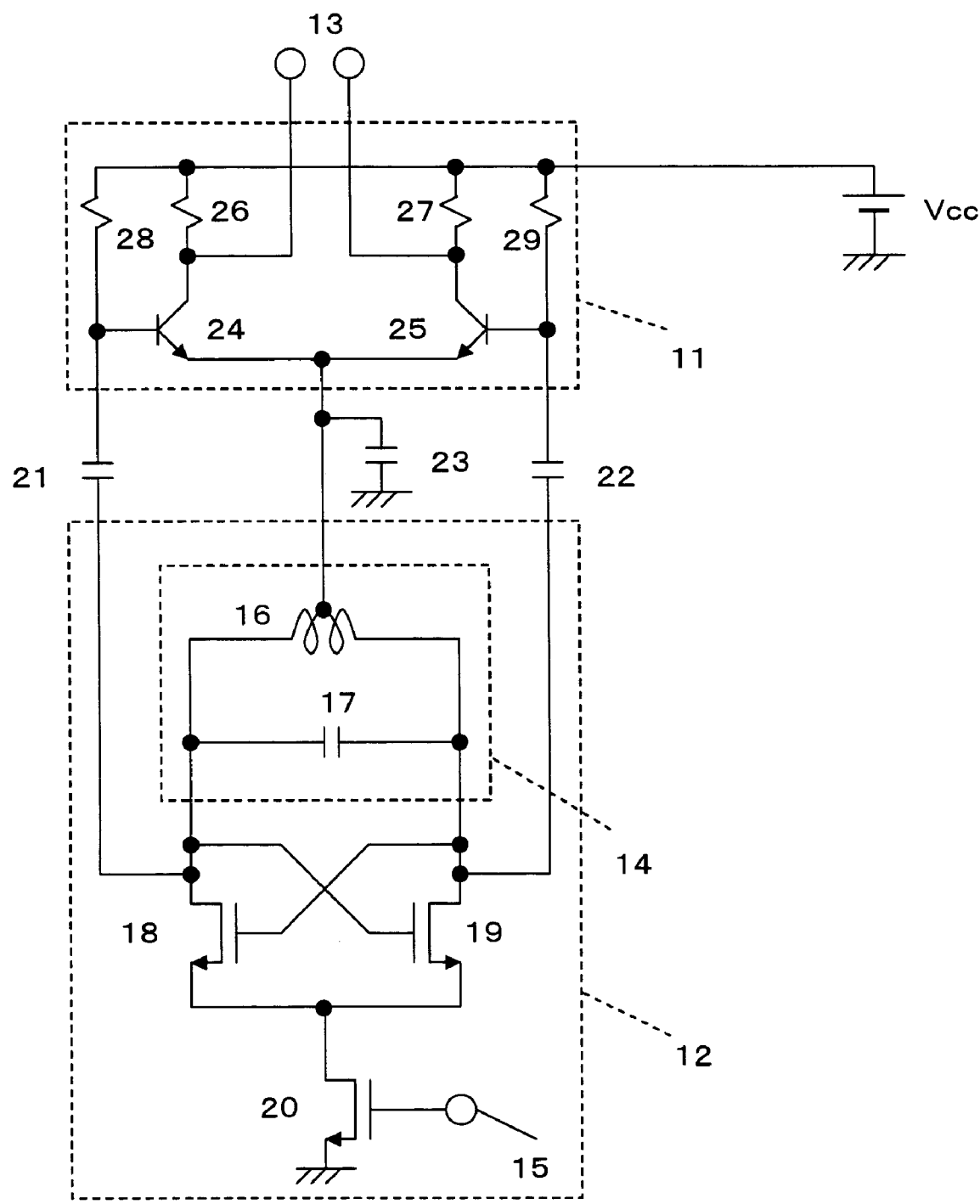
FIG. 1 is a circuit diagram for showing the configuration of a differential oscillator circuit according to a first embodiment of the present invention.
Figure 5:
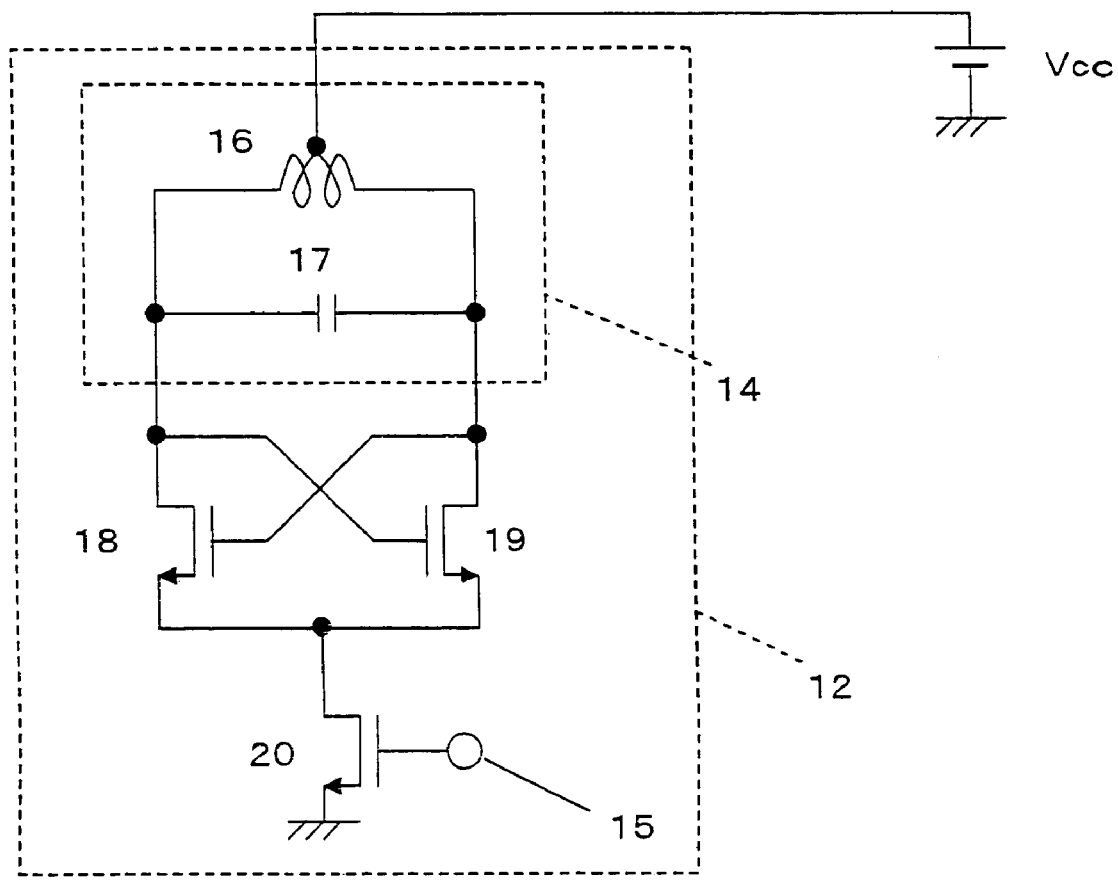
FIG. 5 is a circuit diagram for showing the configuration of a related art differential oscillator.

FIG. 1 is a circuit diagram of the differential oscillator circuit according to the first embodiment of the invention. In FIG. 1, reference numeral 12 denotes a differential oscillator. The differential oscillator 12 has the same configuration as that of the related art differential oscillator shown in FIG. 5.

Reference numeral 11 denotes a differential buffer amplifier. The differential buffer amplifier 11 comprises bipolar transistors 24 and 25 whose emitters are connected to each other, load-resistors 26 and 27 connected to the collectors of the bipolar transistors 24 and 25 respectively, and resistors 28 and 29 connected to the bases of the bipolar transistors 24 and 25 respectively.

The load-resistor 26 and 27 are connected to a power supply voltage Vcc. The common emitter of the bipolar transistors 24 and 25 is connected to the midpoint of an inductor 16.

Thus, the differential buffer amplifier 11 and the differential oscillator 12 are connected in series to the power supply. As a result, a common operating current flows into the differential buffer amplifier 11 and the differential oscillator 12. That is, a current from the pair of bipolar transistors for amplification is fed into a pair of field-effect transistors for oscillation via the midpoint of the inductor. At this time, the operating current for the differential oscillator 12 not only is supplied from the midpoint of the inductor 16 but also acts as a tail current for the differential buffer amplifier 11. The term tail current refers to a bias current fed to the pair of emitter-coupled or source-coupled differential transistors.

Further, a decoupling capacitor 23 is connected to the midpoint of the inductor and has the job of suppressing undesired interference between the differential oscillator 12 and the differential buffer amplifier 11. An oscillating signal from the differential oscillator 12 is input via coupling capacitors 21 and 22 into the differential buffer amplifier 11, and the signal is output from an output terminal 13.

According to the first embodiment, the operating current of the differential oscillator 12 and the operating current of the differential buffer amplifier 11 are common, so that the current consumption of the differential oscillator circuit can be reduced greatly when compared with a case where a differential oscillator and a differential buffer amplifier are driven separately by different operating currents. Further, the adoption of the differential circuit increases immunity to external noise, which reduces the occurrence of unstable oscillation.

Although the embodiment describes the differential oscillator including the field-effect transistors, a differential oscillator having a configuration in which the field-effect transistors are replaced with bipolar transistors can also be given as an embodiment.

Second Embodiment

Figure 2:
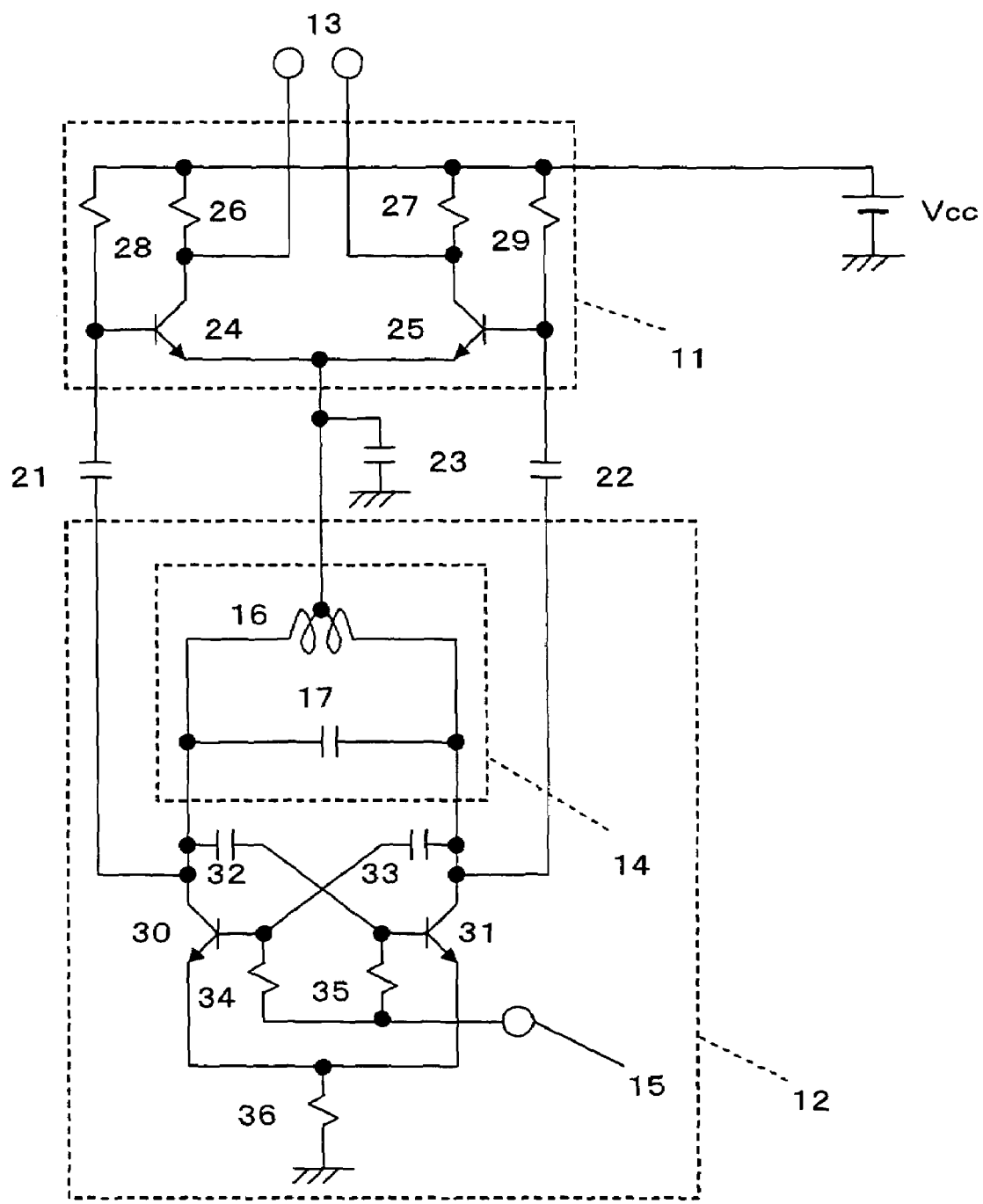
FIG. 2 is a circuit diagram for showing the configuration of a differential oscillator circuit according to a second embodiment of the invention.

FIG. 2 is a circuit diagram for showing the configuration of a differential oscillator circuit according to a second embodiment of the invention. The differential oscillator 12 takes the form of a differential oscillator circuit; the collector of a bipolar transistor 30 is connected via a feedback capacitor 32 to the base of a bipolar transistor 31, and the collector of the bipolar transistor 31 is connected via a feedback capacitor 33 to the base of the bipolar transistor 30. Both ends of a resonator 14 comprised of an inductor 16 and a capacitor 17 in parallel are connected to the collectors of the bipolar transistors 30 and 31 respectively.

The emitters of the bipolar transistors 30 and 31 are grounded via a resistor 36, and the bases of the bipolar transistors 30 and 31 are biased via resistors 34 and 35 from a bias terminal 15, which governs current which flows into the differential oscillator 12. With the configuration of the second embodiment, the configuration other than the differential oscillator 12 is the same as that of the first embodiment shown in FIG. 1.

In addition to the effects of the differential oscillator circuit according to the first embodiment, the differential oscillator circuit according to the second embodiment makes it possible to start oscillation with less current. The reason is as follows: when compared by using the same current value, the gain (gm, i.e., mutual conductance) of bipolar transistors is several times larger than that of MOSFETs. Because of this, bipolar transistors have a margin as to a gain required to start oscillation. Thus the less current is sufficient to achieve the same gain as that of MOSFETs.

Although this embodiment describes the differential oscillator including the bipolar transistors, a differential oscillator having a configuration in which the bipolar transistors are replaced with field-effect transistors can also be given as an embodiment.

Third Embodiment

Figure 3:
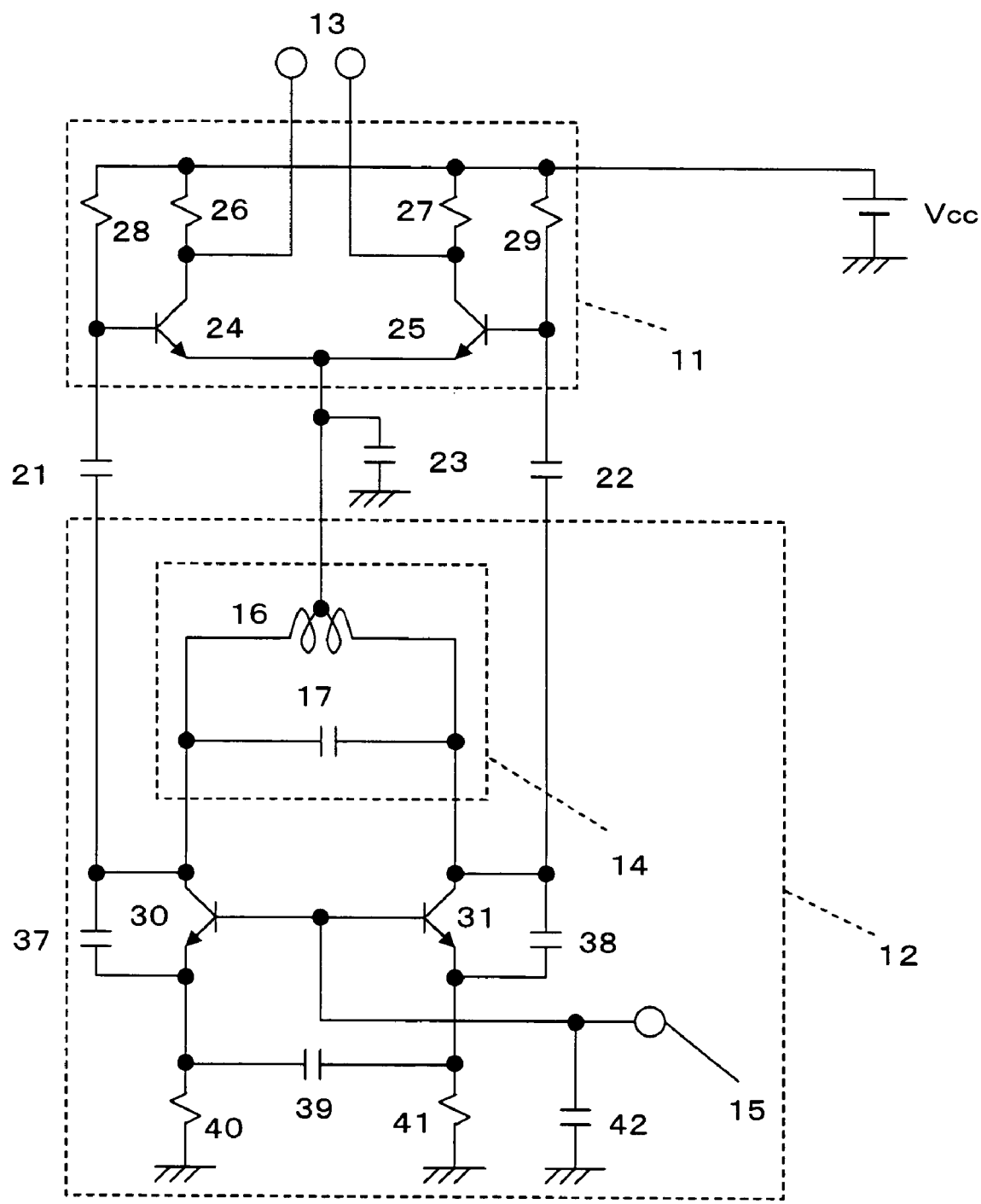
FIG. 3 is a circuit diagram for showing the configuration of a differential oscillator circuit according to a third embodiment of the invention.
Figure 4:
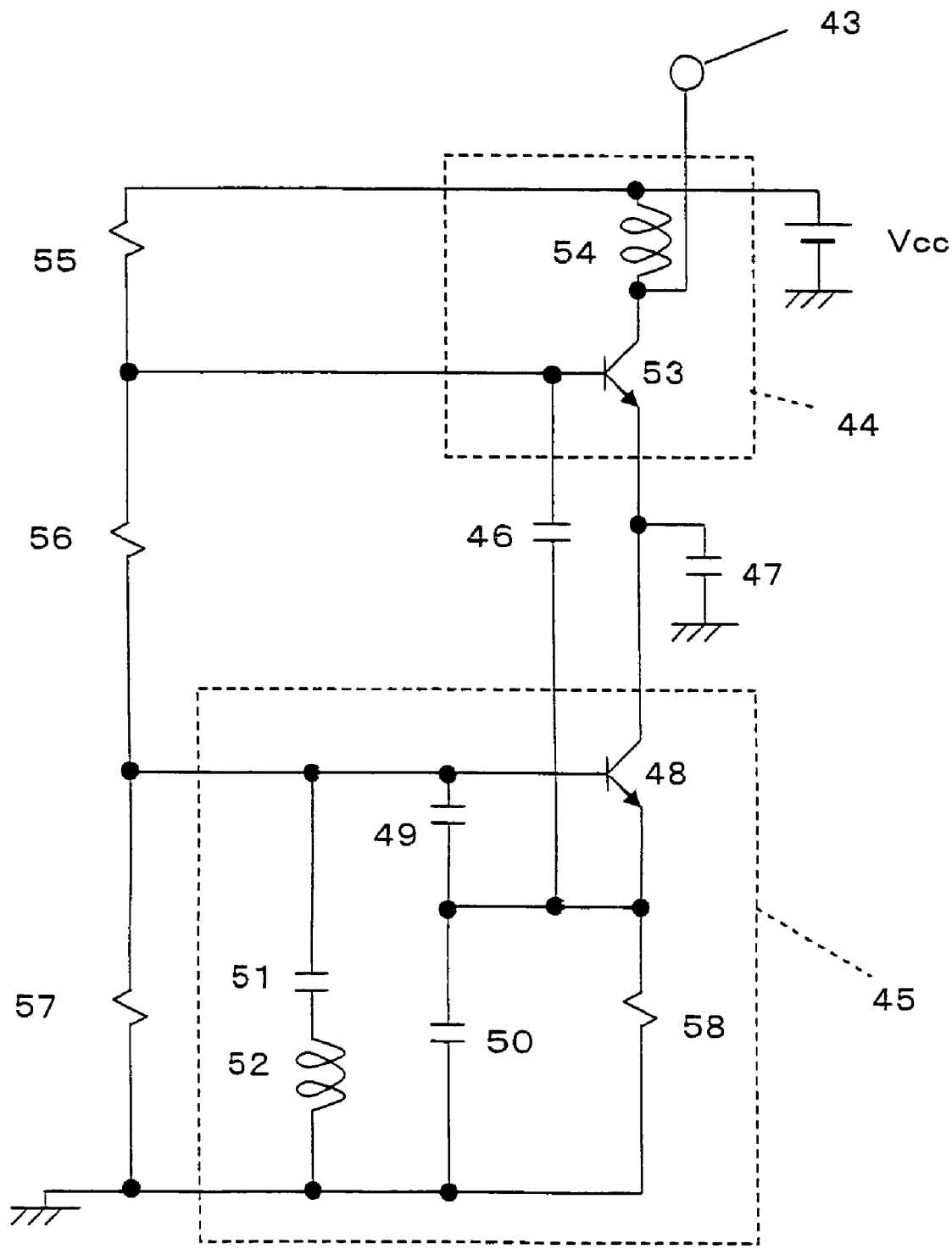
FIG. 4 is a circuit diagram for showing the configuration of a related art oscillator circuit having a buffer amplifier.

FIG. 3 is a circuit diagram for showing the configuration of a differential oscillator circuit according to a third embodiment of the invention. The differential oscillator 12 is a common-base Colpitts oscillator and takes the form of a differential oscillator circuit. The differential oscillator 12 has a configuration in which capacitors 37 and 38 are connected between the collector and the emitter of bipolar transistors 30 and 31 respectively, and a capacitor 39 is connected between the emitters of the bipolar transistors 30 and 31. Both ends of a resonator 14 comprised of an inductor 16 and a capacitor 17 in parallel are connected to the collectors of the bipolar transistors 30 and 31 respectively.

The emitters of the bipolar transistors 30 and 31 are grounded via resistors 40 and 41 respectively, and their bases are biased from a bias terminal 15. As a result, an operating current which flows into the differential oscillator 12 is governed. The bias terminal 15 is grounded via a decoupling capacitor 42.

In the configuration according to the third embodiment, the configuration other than the differential oscillator 12 is the same as that of the first embodiment shown in FIG. 1.

In addition to the effects of the differential oscillator circuit according to the first embodiment, the differential oscillator circuit according to the third embodiment makes it possible to improve phase noise characteristics. The reason is as follows: the Colpitts oscillator has lower sensitivity to conversion from noise generated by its circuit elements to phase noise of its oscillation signal when compared with differential oscillators having different circuit forms.

Although the third embodiment describes the differential oscillator circuit employing the common-base Colpitts oscillator having the bipolar transistors as the differential oscillator, it is also possible to use a common-gate Colpitts oscillator having field-effect transistors as a differential amplifier.

In addition, the resonators of the embodiments are comprised of the inductor and the capacitor in parallel, while a varactor diode may be further connected in parallel to the inductor. A resonance frequency can be changed by changing a voltage fed to the varactor diode.

INDUSTRIAL APPLICABILITY

As described above, the differential oscillator circuit of the present invention is highly immune to noise and is capable of achieving lower current consumption, so that it is useful for semiconductor integrated circuits for portable gear.

What is claimed is:

1. A differential oscillator circuit comprising:
   a differential oscillator having a common-base or common-gate Colpitts oscillator; and
   a differential buffer amplifier into which an output signal from the differential oscillator is input, wherein the passage of an operating current for the differential oscillator is connected in series to the passage of an operating current of the differential buffer amplifier.

2. The differential oscillator circuit according to claim 1, wherein:
   the differential oscillator includes a resonator and a pair of active elements for oscillation;
   the differential buffer amplifier includes a pair of active elements for amplification;
   the operating current for the differential oscillator is a first operating current which flows through the pair of active elements for oscillation; and
   the operating current for the differential buffer amplifier is a second operating current which flows through the pair of active elements for amplification.

3. The differential oscillator circuit according to claim 2, wherein:
   the resonator includes a parallel circuit of an inductor and a capacitor and has a node at the midpoint of the inductor; and
   the differential oscillator is supplied with the operating current from the midpoint of the inductor.

4. The differential oscillator circuit according to claim 2, wherein:
   the pair of active elements for oscillation is a pair of field-effect transistors whose sources are connected to each other;
   the resonator is connected between the drains of the pair of field-effect transistors; and
   the pair of field-effect transistors are connected to each other in such a cross-coupled manner that the drain of one field-effect transistor is connected to the gate of the other field-effect transistor respectively.

5. The differential oscillator according to claim 4, wherein the common source of the pair of field-effect transistors is connected to a field-effect transistor for a current source whose gate is supplied with a predetermined bias voltage.

6. The differential oscillator circuit according to claim 2, wherein:
   the pair of active elements for oscillation is a pair of bipolar transistors whose emitters are connected to each other;
   the resonator is connected between the collectors of the pair of bipolar transistors; and
   the pair of bipolar transistors are connected to each other in such a cross-coupled manner that the collector of one bipolar transistor is connected to the base of the other bipolar transistor respectively.

7. The differential oscillator according to claim 6, wherein:
   the bases of the pair of bipolar transistors are supplied with a predetermined bias voltage via first and second resistors; and
   the common emitter of the pair of bipolar transistors is grounded via a third resistor.

8. The differential oscillator circuit according to claim 2, wherein the resonator includes a varactor diode connected in parallel to an inductor.

* * * * *